US005574270A

United States Patent [19]
Steffen

[11] Patent Number: 5,574,270
[45] Date of Patent: Nov. 12, 1996

[54] CHIP CARD SYSTEM PROVIDED WITH AN OFFSET ELECTRONIC CIRCUIT

[75] Inventor: Francis Steffen, St. Maximin, France

[73] Assignee: SGS-Thomson Microelectronics, S.A., Gentilly, France

[21] Appl. No.: 74,989

[22] Filed: Jun. 10, 1993

Related U.S. Application Data

[63] Continuation of Ser. No. 856,836, Mar. 23, 1992, which is a continuation of Ser. No. 598,062, Oct. 16, 1990.

[30] Foreign Application Priority Data

Oct. 20, 1989 [FR] France ................................. 89 13756

[51] Int. Cl.⁶ ............................................. H05K 7/02
[52] U.S. Cl. ................................. 235/441; 235/492
[58] Field of Search .............................. 235/380, 439, 235/441, 492

[56] References Cited

U.S. PATENT DOCUMENTS

| | | |
|---|---|---|
| 3,702,464 | 11/1972 | Castrucci . |
| 4,277,837 | 7/1981 | Stuckert . |
| 4,423,319 | 12/1983 | Jacobsen ................................. 235/472 |
| 4,660,422 | 4/1987 | Eads et al. ............................. 364/581 |
| 4,800,543 | 1/1989 | Lyndon-Sames et al. ................ 368/10 |
| 4,849,617 | 7/1989 | Ueda ..................................... 235/492 |
| 4,870,604 | 9/1989 | Tatsuno ................................. 235/380 |
| 4,916,441 | 4/1990 | Gombrich ............................. 235/462 |
| 4,941,841 | 7/1990 | Darden et al. ......................... 235/377 |
| 4,999,601 | 3/1991 | Gervais ................................. 235/492 |

FOREIGN PATENT DOCUMENTS

| | | |
|---|---|---|
| 313882A | 5/1989 | European Pat. Off. . |
| 2554262 | 5/1985 | France ................................. 235/441 |

OTHER PUBLICATIONS

Apple Computer, Inc., *DuoDisk Owners Manual*, ©1983. pp. 1, 10–12.
HP41, Owners Handbook and Programming Guide HP41 CV/C pp. 256–259. Apr. 1982.

*Primary Examiner*—Richard A. Rosenberger
*Attorney, Agent, or Firm*—Robert Groover; Betty Formby

[57] ABSTRACT

A chip card system provided with an offset portable electronic circuit includes a module that integrates one or more electronic components, a reader 4 of this module, an intermediate means 3 directly linked with the reader 4 and a conveyance means 2 to provide for the transmission of information between the module 1 and the intermediate means 3, and vice versa. The intermediate means is a chip card that enables access to standard readers. The module can be used to set up a complex application without any problem as regards available surface areas. Moreover, the reliability obtained is that of the mounting of electronic components. It is far greater than that obtained in the technology of mounting a chip in a chip card.

29 Claims, 2 Drawing Sheets 5,574,270

CHIP CARD SYSTEM PROVIDED WITH AN OFFSET ELECTRONIC CIRCUIT

This is a continuation of application Ser. No. 07/856,836, filed Mar. 23, 1992, which is a continuation of Ser. No. 07/598,062 filed on Oct. 16, 1990.

BACKGROUND OF THE INVENTION

1. Field of the Invention

The present invention concerns a chip card system provided with an offset portable electronic circuit. This system can be used in the field of chip cards.

The various new uses of the chip card show that this card is destined to fulfill increasingly complex functions, if its field of application is to be extended. This entails, then, the need to use increasingly bigger surface areas of chips to be integrated into these cards in order to fulfill these functions. This is the case, for example, with two known applications of chip cards, namely the telephone card and the bank card. The chip of the telephone card is a simple memory. It takes up a surface area of the order of one $mm^2$. The chip of a bank card is a processor that integrates memory. It takes up a surface area of the order of 20 $mm^2$. This is so for a given state of the art in semiconductor integration. It is indeed well known that ongoing progress is being made in the field of semiconductor integration. This means that for one and the same integrated circuit size, it will become possible to integrate increasingly more functions.

It may briefly be recalled that a chip card is a relatively slim plastic card, wherein a semiconductor chip and a grid of conductors are inset in the thickness of the card. The chip is mounted on an upper surface of the grid, for example by bonding. Conductive wires are then soldered, firstly, to output terminals of the chip and, secondly, to metallizations of the grid. This is the chip card mounting technology known as the chip on board technology. A lower surface of the grid is flush with one of the two surfaces of the card, and forms the connector of the chip card. When this card is inserted into the reader, it is to this connector that the reader gets connected.

Standard readers, such as those of public telephones and banking systems, have imposed a standardization of chip cards. We can distinguish, firstly, a standardization of the card itself, as an object. This standardization of the shape and thickness has been dictated by the prior existence and use of magnetic cards, with the aim of using readers of already existing magnetic cards. Then, we can distinguish a standardization of the connector, related to the shape, number and connection system pitch of the contact zones of the connector and also related to the assigning of a determined signal to each contact zone, in accordance with a communications protocol. Finally, we can distinguish a standardization of the relative position of the connector on the card. A French standardization provides a position of the connector in a corner of the card. A German standardization provides a position of the connector in the middle.

The standardization of the connector dictates, in particular, a determined distribution of the contact zones of the connector which necessitate a use of non-extensible free surface area. This surface area restricts the possible surface area of the chip that is to be mounted on the this connector with the chip on board technology. Indeed, the width of the chip should be entirely included in that taken up by the connector.

In addition to this first technological limitation on the area of the card capable of integration into a chip card, there is a second one. Indeed, the standard support of the chip card is ill-suited to a chip with a large surface area. While the support is flexible, the chip for its part is very rigid. The bigger the chip, the more sensitive it is to strains and the greater are the chances of its being damaged. In practice, the effect of this is to reduce the reliability of the chip card, when it integrates a big chip. This is not tolerable in certain applications of the chip card, notably banking applications.

2. Description of the Prior Art

Various known techniques have been used to resolve this problem. It has been attempted, notably, to reduce the extent of the strains on the chip and the wires that connect it to its grid of connectors. We might cite, for example, the known use of a slab of cobalt placed beneath the substrate of the chip to rigidify the chip. In another example, the method for making a cavity so that the chip can be received in the card is modified in order to make rigid the chip environment. However, in this chip card mounting technology, these approaches do not enable mounting on large surfaces, with areas of more than 20 $mm^2$ for example. And, for surface areas such as this, numerous problems arise, notably the problem of the reliability of the chip thus mounted.

Besides, the plastic material that forms the card is not impervious to the various forms of ion and organic pollution to which the chips of the integrated circuit are very sensitive. The deterioration in reliability that is caused is all the more aggravated as the chip size increases. This is a third technological limitation.

Finally, the mounting technology used is of the hybrid type. It is not optimized in terms of production. Indeed, semiconductor mounting technology uses a standard line for making a product in very large quantities. This product consists of one or more chips mounted in a standard package and called an electronic component. Beside these electronic components produced in large quantities, we therefore have a specific product, for example the chip mounted on a conductor grid for the chip card. This specific product is produced in far smaller quantities. But it too requires a specific production line. This considerably increases the production costs and depreciation costs of this line, as compared with those of production lines for standard products. Furthermore, the reject rate of this specific product is far higher than that of standard products because of the technology used. Indeed, the fixing of the wires is a delicate operation, the reliability of which directly affects the final product. These wires require specific protection to ensure that they do not deteriorate. To circumvent these difficulties, it has also been attempted, in what is called "tape automatic bonding"technology, to connect metallizations lead ends of the grid, particularly by hot transfer process, to the terminals of the chip. However, this technology also suffers from the degree of manufacturing precision that it requires. It too does not lead to sufficient reliability of mounting.

SUMMARY OF THE INVENTION

It is an object of the invention to overcome these drawbacks and enable the development of the chip card towards novel applications of greater complexity.

An object of the invention, therefore, is a system for the connection of a portable electronic module. The module includes at least one electronic component. The system includes a reader to enter into communication with this module, an intermediate means directly linked with this reader and a conveyance means directly linked with this module. The conveyance means is electrically linked with the intermediate means and is used to provide for the transmission of information between the intermediate means and the module, and vice versa, wherein the module, the conveyance means and the intermediate means are physically linked. The intermediate means is a chip card without chips but provided with a connector compatible with the reader. The conveyance means is flexible.

Another object of the invention is also a system for the connection of a portable electronic module, said module including at least one electronic component. The system includes a reader to enter into communication with this module, an intermediate means directly linked with this reader and a conveyance means used to provide for the transmission of information between the intermediate means and the module, and vice versa. The intermediate means is a chip card without chips but provided with a connector compatible with the reader, and with a transmitter/receiver to communicate with the conveyance means, and wherein the conveyance means includes a transmitter/receiver to communicate with the intermediate means.

BRIEF DESCRIPTION OF THE DRAWINGS

The characteristics of a system according to the invention are given in the following description, made with reference to the appended drawings. This description and these figures are given purely by way of example and in no way restrict the scope of the invention.

DETAILED DESCRIPTION OF THE INVENTION

Figure 1:
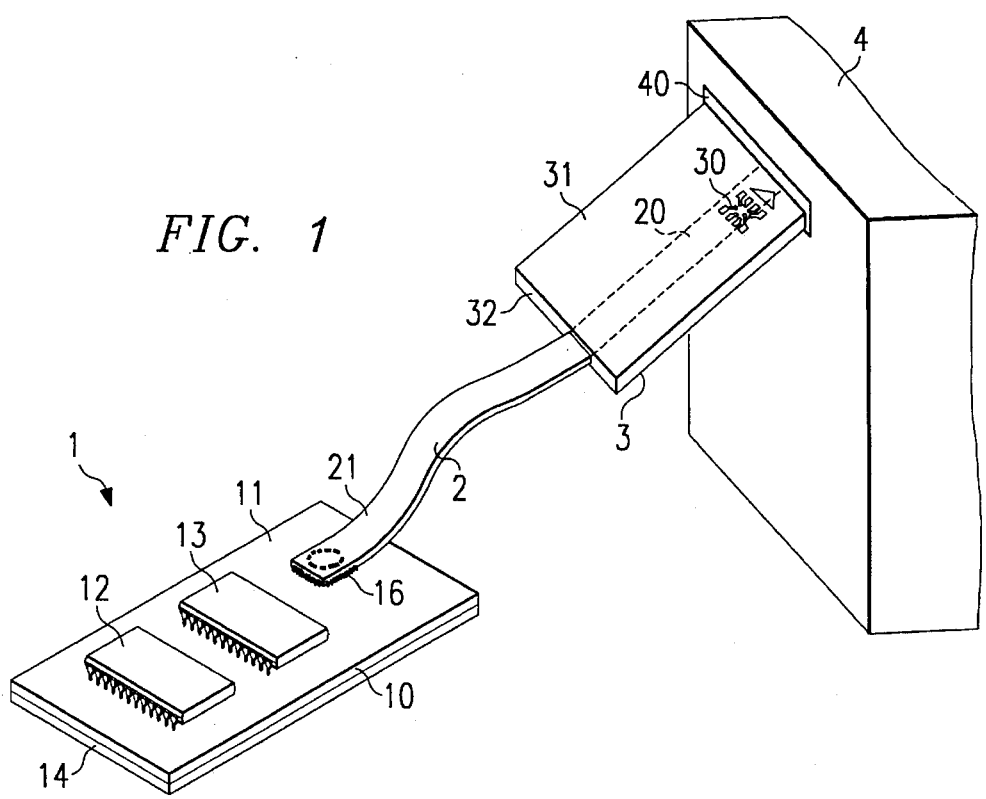
FIG. 1 shows the different functions of a system according to the invention.
Figure 2:
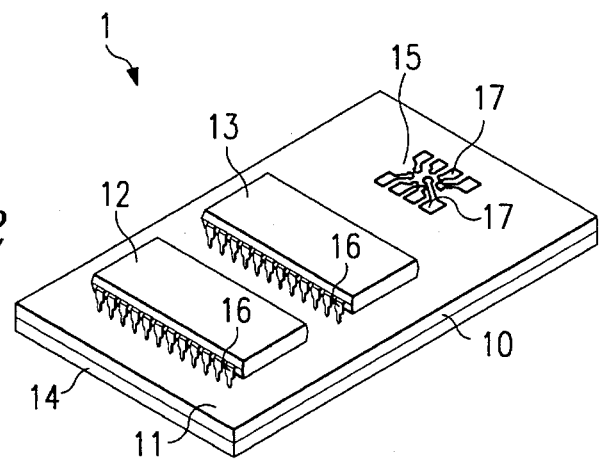
FIG. 2 is a view representing the module according to the invention.
Figure 3A:
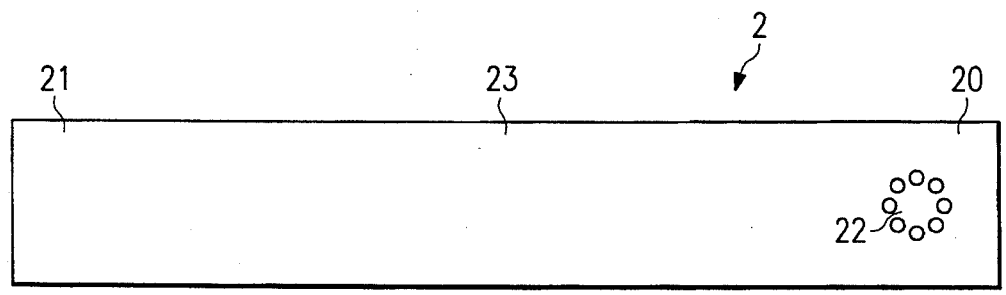
FIG. 3 is a set of sectional views of a conveyance means formed by a flexible strip.
Figure 3B:
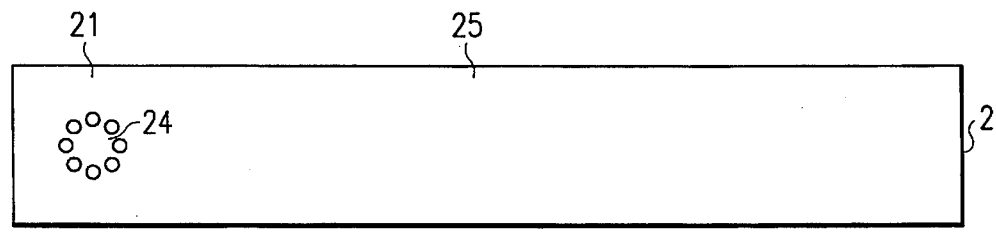
Figure 3C:
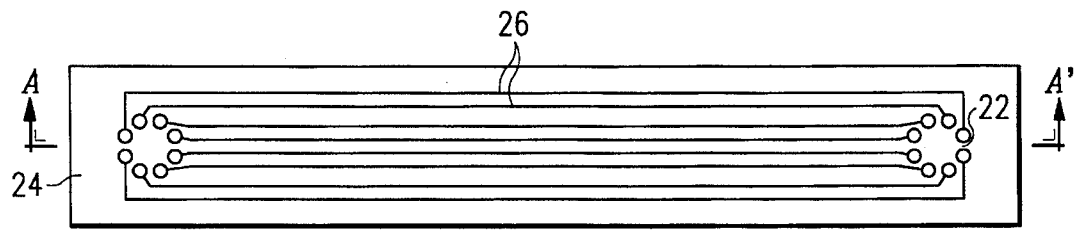
Figure 3D:
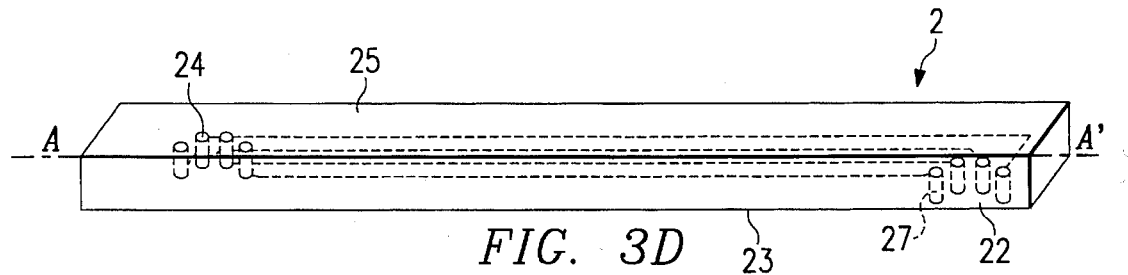

FIG. 1 shows a module 1, a conveyance means 2, an intermediate means 3 and a reader 4. The module 1 is supplied with electrical power from the reader 4, through the intermediate means 3 and the conveyance means 2. It has a connection support 10. In the example of FIGS. 1 and 2, this connection support is a multilayer printed circuit. One or more electronic components are mounted on one of its surfaces 11. For example, two electronic components 12 and 13 are mounted on the surface 11. A connector 15 shown in FIG. 2 is flush with this same surface 11, or with the opposite surface 14. In the example of FIGS. 1 and 2, the connector 15 is flush with the surface 11. In the example of FIGS. 1 and 2, the connector 15 is flush with the surface 11. The connector 15 connects pins 16 of the electronic components 12 and 13 to the outputs of the module 1. These outputs of the module are the external contact zones 17 of the connector 15. They are flush with the surface 11. They are connected to the pins of the electronic components by the interior of the connector.

The intermediate means 3 gets entirely inserted in the slot 40 of a reader 4. The intermediate means 3 is, for example, a chip card, or any other means that can be read by a reader 4. The reader 4 is partially shown in FIG. 1. When the reader 4 communicates with the chip card 3, it gets connected to the external contact zones of a connector 30 which is flush with a surface 31 of the chip card 3. The connector 30 conforms to the definition of the connection with the reader 4. The chip card may integrate one or more connectors on which no chips or several chips are mounted. In a preferred example, it has only one connector on which no chip is mounted. However, in the rest of the description, it shall continue to be called a chip card. In the example, the entire electronic circuitry is made in the module 1 which can integrate several functions.

The conveyance means 2 is shown in detail in the different sectional views of FIG. 3. In this figure, the conveyance means has two ends 20 and 21. At the end 20, a connector 22 is flush with an upper surface 23 of the conveyance means 2. This connector is compatible with an interconnection with the connector 30 of the chip card 3. At the end 21, a connector 24 is flush with a lower surface 25 of the conveyance means 2. This connector is compatible with an interconnection with the connector 15 of the module 1. In a preferred example, the conveyance means is a flexible strip of insulator material within which and/or on which conduction zones have been etched: in the example of FIG. 3, these conduction zones are the two connectors 22 and 24 and conduction wires 26. The conduction wires are etched inside the strip. The contact zones of the connector are external, i.e. they are etched on a surface of the strip. Each conduction wire links a contact zone of the connector 22 to a contact zone of the connector 24. The connection between the end of a wire and an external contact zone of the connectors 22 or 24 is done by a metallized hole 27 beneath the external contact zone, between the surface with which the contact zone is flush and the plane in which the conduction wires are etched.

The end 20 of the conveyance means 2 is fixed in the intermediate means 3. Each contact zone of the connector 22 is in contact with a contact zone of the connector 30. The contact is made by the interior of the connector 30. The fixing is achieved, for example, by soldering between the connector 22 and the internal part of the connector 30. The conveyance means is positioned so that it reaches the chip card 3 by the side 32 opposite to the one by which the chip card 3 is inserted in the slot 40 of the reader 4. The entire part of the conveyance means 2, from its level at the side 32 up to the end 20, is held in the coating material of the chip card 3.

The end 21 of the conveyance means 2 is fixed to the surface 11 of the module 1. The fixing is done, for example, by a solder connection 16. The end 21 is fixed in such a way that each contact zone of the connector 24 is in contact with a contact zone of the connector 15. Here, the contact is made on the external contact zones of the connector 15.

In the preferred example, the surface part of the connector 15 of the module 1 is identical to that of a chip card, and hence to the superficial part of the connector 30 of the chip card 3. The surface part of the connectors 22 and 24 of the conveyance means 2 is identical to the internal part of a connector of a chip card. Thus, it is easy to join the connectors 15 and 24 and the connectors 30 and 22 together since they are the external (15 and 30) and internal (24 and 22) standardized parts of a chip card connector.

In fact, it is also possible to have only one support having the connector 30 of the chip card on it and providing for the interconnection between this connector 30 and an offset electronic circuit as described previously. Indeed, it is possible to make one and the same support, with several materials, for example, a printed circuit and a flex, the flex being then a layer of the printed circuit. Under these conditions, the interconnection support is common to the module 1, the conveyance means 2 and the chip card 3. There is no longer any soldering or fastening to be done to assemble the module 1 with the conveyance means 2 and the conveyance means 2 with the chip card 3.

Figure 4:
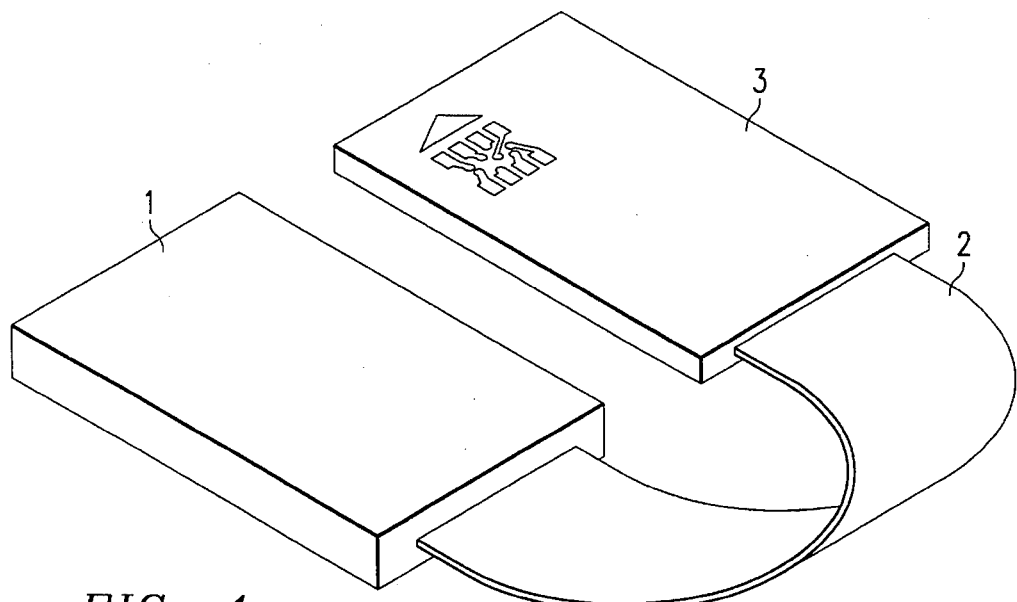
FIG. 4 shows a system according to the invention.

FIG. 4 shows a module 1, a conveyance means 2 and a chip card 3 according to the description just made. The module 1 is inset in a material which may or may not be dielectric. If it is not dielectric, the metal connections of the electronic components will be protected by an insulator. Since the module has electronic components, the thickness of the unit greater than the thickness of a chip card, in the current state of the art relating to electronic components.

The use of a flexible strip enables the module to be folded on the chip card. The entire unit can then easily be put into a pocket. A rigid conveyance means, for example a printed circuit, could be used. In this case, it is also possible to coat the unit formed by the module 1, the conveyance means 2 and the chip card 3. We would then have a relatively rigid product, rectangular for example, with two thicknesses: the rather small thickness of the chip card (about 0.8 mm) and the greater thickness of the module (from 1.5 mm onwards).

In the example of FIG. 1, in the connection between the connector 15 and the connector 30, only the connector 30 is not protected so that the reader connects to the top. All the rest of this connection is, on the contrary, insulated, so that no electrical disturbance can be superimposed on the signals transmitted.

Information can be conveyed between the intermediate means and the module by any kind of means other than an interconnection support such as a flexible strip or a printed circuit. For example, it can be done by radio transmission. In this case, the conveyance means then includes a transmitter and a receiver with an antenna in a module 1 and in the card. The module 1 and the chip card are then two distinct portable objects. For reasons of convenience, however, they may be attached to each other, by a flexible wire for example. It is necessary, however, to provide in this case for an energy amplifier integrated into the module 1 if the supply to the module is transmitted by radio from the reader 4 through the chip card 3. It may be preferred to integrate a rechargeable battery into the module 1.

The system that we have just described shows numerous advantages as compared with conventional chip cards. And this is because the electronic part, the module 1, is disassociated from the connections system part. Indeed, it can be used firstly to make a complex electronic circuit, by the mounting of one or more electronic components that may or may not be interconnected. There are no longer any limits of surface area of the electronic circuit as there are with chip cards. Furthermore, these electronic components may themselves be complex components integrating, for example, in their package several chips mounted on a multilayer printed circuit.

It will be recalled that the multilayer printed circuit enables the making of, firstly, interconnections among electronic elements, chips or components, to set up a function. Secondly, it enables the making of the outward connection, namely the outputs of the function set up. When the printed circuit on which several chips are mounted is integrated into a package, the outputs of the function set up are then pins of the package of the electronic component thus made. In the current state of the technology for mounting chips in a chip card, there is no equivalent to the multilayer printed circuit.

In the system described, the reliability of the electronic circuit is considerably improved as compared with the standard technology of chip cards. Indeed, a package, made of plastic or ceramic for example, of an electronic component is rigid. It is also impervious, notably to the various forms of ionic and organic attack. It is this package that improves the reliability. Furthermore, the module itself may be more rigid than the chip card since it is not the module that is inserted in the reader. In conclusion, in the invention, there is thereby sufficient reliability obtained to achieve complex applications, especially banking applications. This could not be envisaged with the standard technology of the chip card for reasons already explained.

There is a variety of choices of a technology for mounting the electronic components in the module 1: it may be any standard technology such as, for example, insertion or surface mounting. In the example of figures 1 and 2, the components are surface mounted ones. They enable higher density of integration on the printed circuit. It is moreover possible to mount such components on each of the two surfaces of the printed circuit. This is not possible with an insertion technology. The choice of the type of package is also varied. What is important is the optimization of the cost of manufacturing the module, depending on the density of integration necessary for the application in view, the manufacturing cost and the reject rate in each of the various technologies.

Indeed the manufacturing cost aspect is very important in the field of chip cards. For, the aim of the users is to have a very low purchase price. For this reason, as we have already seen, the production and depreciation costs induced by the use of a specific production line in standard chip card technology is a major drawback of this technology as regards the manufacturing cost aspect. In addition to this factor, there is the high reject rate, a rate that is higher than the one obtained in the standard technology of semiconductors. The use of electronic components overcomes all these drawbacks. In effect, the production lines are then standard semiconductor mounting lines. Moreover, when the electronic components are mounted on the printed circuit, if they fail the final test, a component that may be defective can be unsoldered and replaced by another one. A printed circuit that may be defective can be changed and the component can be kept: the module is not lost in its entirety. This represents a clear advantage over the chip card: if the chip card is defective, nothing can be recovered from it.

The use of a chip card as an intermediate means resolves the problem of the standardizations and/or standards. Herein lies all its value. In the preferred example, the chip card has a standardized connector compatible with the connection of a reader: the chip card is a standard intermediate means for direct reading by a reader. Its manufacture is inexpensive for there is no mounting of chips.

In short, the invention thus enables the standards or standardization of chip card readers to be met without allowing these standards to become constrictive. It allows for every novel and complex application. It considerably improves the reliability of the electronic part. It reduces manufacturing costs and depreciation costs by providing a standard technology electronic circuit wherein only the application is specific, as compared with the conventional chip card wherein the electronic circuit is specific both in its application and its technology.

What is claimed is:

1. A smart card unit, comprising: an intermediate card which physically corresponds to a standard smart card physical format, and which includes thereon connectors in a standard smart card connector format and in a standard smart card connector location, but which does not include any active circuitry whatsoever; and a portable pocket-size electronic module comprising one or more integrated circuits which implement normal smart card operation, and permanently connected to said intermediate card by a flexible connector;

whereby said portable pocket-size module can interface to a standard card reader through said flexible connector and said intermediate card.

2. The smart card unit of claim 1, wherein said integrated circuits have a pinout arrangement which is standard in applications other than smart cards.

3. The smart card unit of claim 1, wherein said module also comprises a battery.

4. The smart card unit of claim 1, wherein at least one of said integrated circuits has an area greater than 20mm$^2$.

5. The smart card unit of claim 1, wherein said intermediate card does not include any active circuitry whatsoever.

6. The smart card unit of claim 1, wherein said connector is a flat flexible plastic body with patterned metal film traces therein.

7. The smart card unit of claim 1, wherein said connector is permanently connected to said intermediate card and to said portable electronic module.

8. A smart card unit, comprising:

a flexible intermediate card which physically corresponds to a standard smart card physical format, and which includes thereon connectors in a standard smart card connector format and in a standard smart card connector location; and a rigid portable pocket-size electronic module comprising one or more integrated circuits which implement normal smart card operation, and connected to said intermediate card by a flat flexible connector which is oriented so that said portable pocket-size module and said intermediate unit can be folded together compactly when not in use;

whereby said portable pocket-size module can interface to a standard card reader through said flexible connector and said intermediate card.

9. The smart card unit of claim 8, wherein said integrated circuits have a pinout arrangement which is standard in applications other than smart cards.

10. The smart card unit of claim 8, wherein said module also comprises a battery.

11. The smart card unit of claim 8, wherein at least one of said integrated circuits has an area greater than 20mm$^2$.

12. The smart card unit of claim 8, wherein said intermediate card does not include any active circuitry whatsoever.

13. The smart card unit of claim 8, wherein said connector is a flat flexible plastic body with patterned metal film traces therein.

14. The smart card unit of claim 8, wherein said connector is permanently connected to said intermediate card and to said portable electronic module.

15. A smart card unit, comprising:

a plastic intermediate card which physically corresponds to a standard smart card physical format, and which includes thereon connectors in a standard smart card connector format and in a standard smart card connector location; and a portable pocket-size electronic module, comprising one or more integrated circuits which implement normal smart card operation within a hermetic encapsulation material, permanently connected to said intermediate card by a flexible connector;

whereby said portable pocket-size module can interface to a standard card reader through said flexible connector and said intermediate card.

16. The smart card unit of claim 15, wherein said integrated circuits have a pinout arrangement which is standard in applications other than smart cards.

17. The smart card unit of claim 15, wherein said module also comprises a battery.

18. The smart card unit of claim 15, wherein at least one of said integrated circuits has an area greater than 20mm$^2$.

19. The smart card unit of claim 15, wherein said intermediate card does not include any active circuitry whatsoever.

20. The smart card unit of claim 15, wherein said connector is a flat flexible plastic body with patterned metal film traces therein.

21. The smart card unit of claim 15, wherein said connector is permanently connected to said intermediate card and to said portable electronic module.

22. A smart card unit, comprising:

an intermediate card which physically corresponds to a standard smart card physical format, and which includes thereon connectors in a standard smart card connector format and in a standard smart card connector location; and a portable pocket-size electronic module comprising one or more integrated circuits which implement normal smart card operation, and permanently connected to said intermediate card by a flexible connector;

wherein said portable pocket-size electronic module is substantially thicker than said intermediate card, and does not conform to said standard smart card physical format;

whereby said portable pocket-size module can interface to a standard card reader through said flexible connector and said intermediate card.

23. The smart card unit of claim 27, wherein said integrated circuits have a pinout arrangement which is standard in applications other than smart cards.

24. The smart card unit of claim 27, wherein said module also comprises a battery.

25. The smart card unit of claim 25, wherein at least one of said integrated circuits has an area greater than 20mm$^2$.

26. The smart card unit of claim 24, wherein said intermediate card does not include any active circuitry whatsoever.

27. The smart card unit of claim 23, wherein said connector is a flat flexible plastic body with patterned metal film traces therein.

28. The smart card unit of claim 22, wherein said connector is permanently connected to said intermediate card and to said portable electronic module.

29. A method for interfacing to a standard smart card reader, comprising the steps of:

inserting, into a standard smart card reader, an intermediate card which physically corresponds to a standard smart card physical format, and which includes thereon connectors in a standard smart card connector format and in a standard smart card connector location, but which does not include any active circuitry whatsoever; said intermediate card being permanently connected, through a flexible connector, to a portable pocket size electronic module comprising one or more integrated circuits; and electronically communicating between said portable pocket-size module and said standard card reader through said flexible connector and said intermediate card to perform normal smart card operation.

* * * * *